United States Patent
Kim et al.

(10) Patent No.: US 7,123,058 B2
(45) Date of Patent: Oct. 17, 2006

(54) SIGNAL DETECTING CIRCUIT AND METHOD THEREFOR

(75) Inventors: Yong-Jun Kim, Seongnam-si (KR); Myung-Bo Kwak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 10/844,502

(22) Filed: May 13, 2004

(65) Prior Publication Data

US 2004/0230388 A1 Nov. 18, 2004

(30) Foreign Application Priority Data

May 15, 2003 (KR) .................. 10-2003-0030903

(51) Int. Cl.
*H03K 5/22* (2006.01)
(52) U.S. Cl. .................. 327/90; 327/62; 327/65; 327/97
(58) Field of Classification Search .......... 327/50, 327/51, 52, 56–58, 60, 62–65, 68–72, 75, 327/76, 77, 85, 89, 90, 18, 20, 97; 702/64, 702/65
See application file for complete search history.

(56) References Cited

U.S. PATENT DOCUMENTS 5,889,419 A * 3/1999 Fischer et al. ................ 327/70
6,809,566 B1 * 10/2004 Xin-LeBlanc ................ 327/65

FOREIGN PATENT DOCUMENTS

JP 2002064366 2/2002

* cited by examiner

*Primary Examiner*—Long Nguyen
(74) *Attorney, Agent, or Firm*—Harness, Dickey & Pierce, P.L.C.

(57) ABSTRACT

A stable, low power consumption signal detecting circuit may include: a delay circuit, which receives a base clock signal and generates multiple versions thereof having time delay relationships thereto, respectively; dual amplifiers, which detect valid ones of input signals by comparing the input signals with reference voltage signals in response to the multiple versions of the base clock signal, respectively; a combining unit, which generates a combination signal in response to output signals of the dual amplifiers; and a sampling circuit, which samples the combination signal according to the base clock signal and generates an output signal.

23 Claims, 8 Drawing Sheets

SIGNAL DETECTING CIRCUIT AND METHOD THEREFOR

CROSS-REFERENCE TO RELATED APPLICATIONS

This U.S. nonprovisional patent application claims priority under 35 U.S.C. § 119 of Korean Patent Application 2003-30903 filed on May 15, 2003, the entire contents of which are hereby incorporated by reference.

BACKGROUND OF THE INVENTION

In general, in a high speed communication for data transmission in the GHz range, a differential serial interface has been used to avoid crosstalk and noise coupling generated in a parallel interface. The differential serial interface is mainly constructed with a comparator circuit.

Typically, the comparator circuit receives two input signals, compares voltages thereof, and generates an output signal in response to a comparison result. A differential voltage comparator is a type of comparator for comparing two differential input signal voltages and outputting a differential output.

For example, the differential comparator may be used to detect squelch or un-squelch of a receiving unit for receiving input signals. The receiving unit is connected to a communication line or a bus, and determines whether a real signal exists on the communication line. Referring to the Serial ATA Specification, a signal speed and a signal threshold range should be 1.5 Gbps and 50~200 mV, respectively. In signal detection according to the Serial ATA specification, since the signal speed is high and the signal voltage is small, it is difficult to implement the comparator circuit by conventional techniques. Although this can be achieved, the implementation results in high power consumption, which is worsened when the signal speed is increased to 2, 3, and 10 Gbps.

SUMMARY OF THE INVENTION

At least one embodiment of the present invention provides a low power consumption signal detecting circuit capable of stable detection even a high data rate signal; and at least one embodiment provides a corresponding method of detecting a signal.

According to at least one embodiment of the present invention, there is provided a stable, low power consumption signal detecting circuit. Such a signal detecting circuit may include: a delay circuit, which receives a base clock signal and generates multiple versions thereof having time delay relationships thereto, respectively; dual amplifiers, which detect valid ones of input signals by comparing the input signals with reference voltage signals in response to the multiple versions of the base clock signal, respectively; a combining unit, which generates a combination signal in response to output signals of the dual amplifiers; and a sampling circuit, which samples the combination signal according to the base clock signal and generates an output signal.

Additional features and advantages of the invention will be more fully apparent from the following detailed description of example embodiments, the accompanying drawings and the associated claims.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention and operational advantages thereof can be fully understood by referring to the accompanying drawings and explanations of example embodiments thereof. In the drawings, the same reference numerals indicate the same elements.

Figure 1:
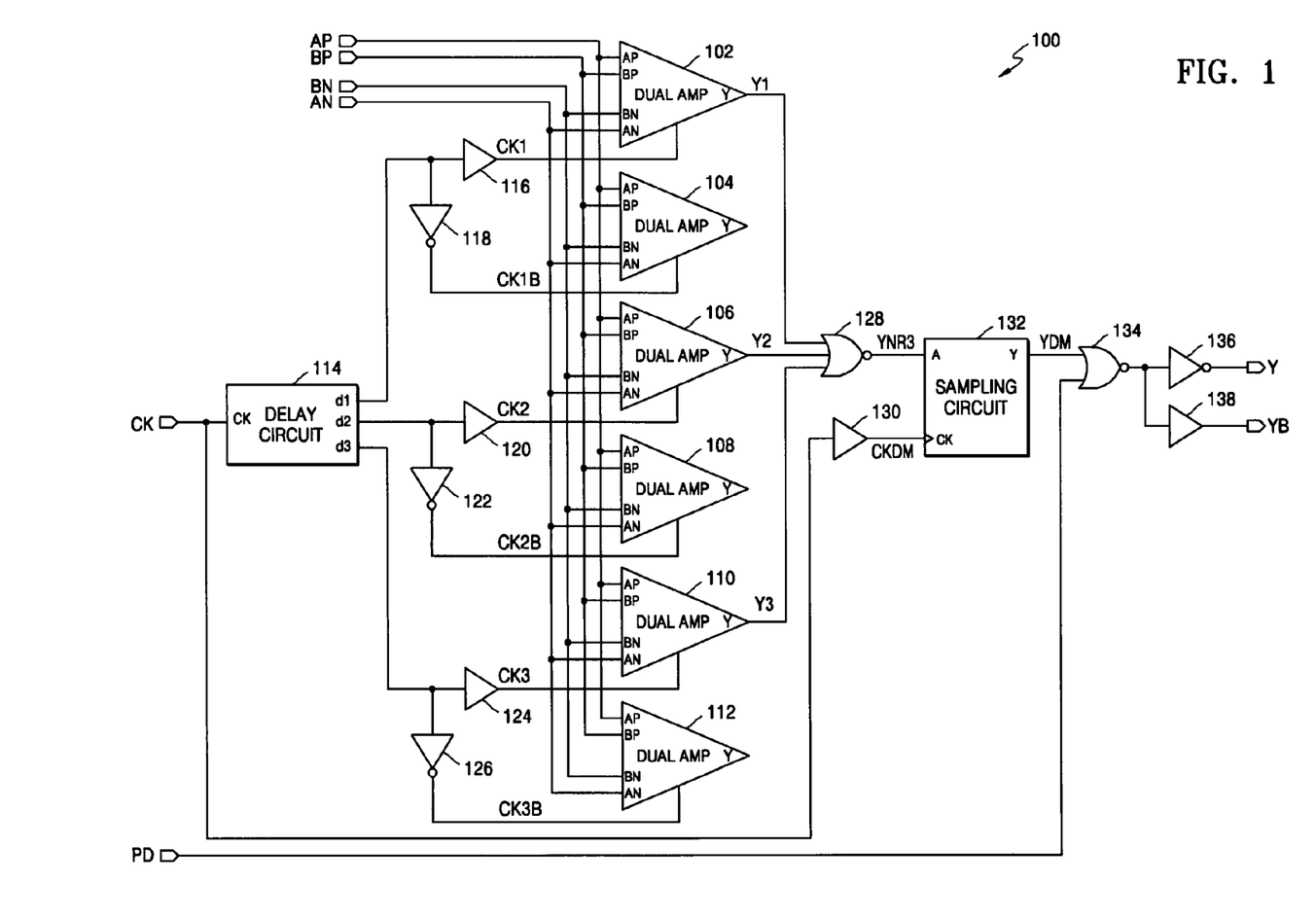
FIG. 1 is a schematic view illustrating a signal detecting circuit according to at least one embodiment of the present invention.

FIG. 1 is a schematic view illustrating a signal detecting circuit according to at least one embodiment of the present invention. Referring to FIG. 1, a signal detecting circuit 100 responds to a clock signal CK and detects whether input signals AP and AN signals are real signals (as contrasted to noise and/or crosstalk) by respectively comparing the input signals AP and AN with reference signals BP and BN.

The signal detecting circuit 100 comprises: dual amplifiers 102, 104, 106, 108, 110, and 112, to which the input signals AP and AN and the reference signals BP and BN are input; a delay circuit 114, to which the clock signal CK is input; buffers 116, 120, and 124; inverters 118, 122, and 126, to which output signals d1, d2, and d3 of the delay circuit 114 are respectively input; a logical NOR gate 128, to which output signals Y1, Y2, and Y3 of the dual amplifiers 102, 106, and 110 (used as clock buffers) are respectively input; an inverter 130, to which the clock signal CK is input; a sampling circuit 132 to which an output YNR3 of NOR gate 128 and an output CKDM inverter 130 are input; a logical NOR gate 134, to which a power down signal PD and an output signal YDM of the sampling circuit 132 are input; an inverter 136; and a buffer 138, to which an output signal of the NOR gate 134 is input.

In FIG. 1, no outputs of dual amplifiers 104, 108 and 112 are depicted, for simplicity of illustration. The outputs of dual amplifiers 104, 108 and 112 are provided to similar componentry and in a similar manner as are the outputs of dual amplifiers 102, 106 and 110.

Figure 2:
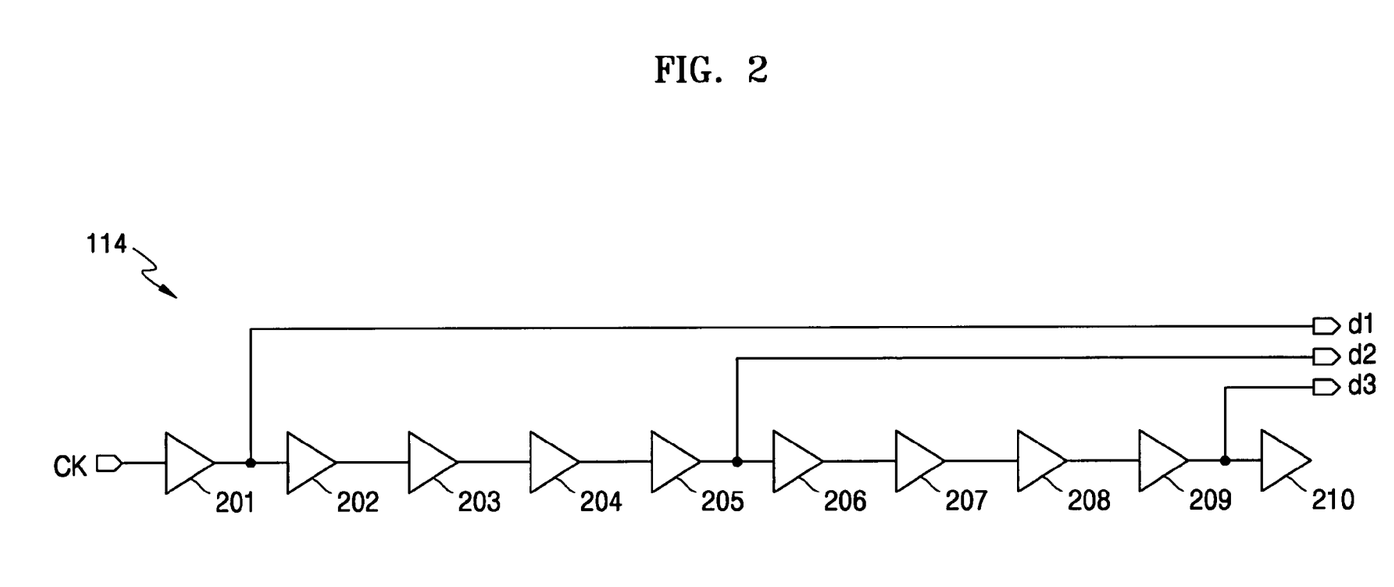
FIG. 2 is a schematic view illustrating in more detail a delay circuit of FIG. 1, according to at least one embodiment of the present invention.

FIG. 2 illustrates the delay circuit 114 in more detail, according to at least one embodiment of the present invention. The delay circuit 114 comprises buffers 201 to 210, which are serially connected. The output signals d1 of the first buffer 201 to which the clock signal CK is input, the output signal d2 of the fifth buffer 205, and the output signal d3 of the ninth buffer 209 are generated at separate intervals. The output signals d1, d2, and d3 of the delay circuit 114 are applied to pairs of dual amplifiers 102 and 104, 106 and 108, and 110 and 112 through buffers 116, 120, and 124 (respectively emerging as clock signals CK1, CK2 and CK3) and inverters 118, 122, and 126 (respectively emerging as clock signals CK1B, CK2B and CK3B), respectively.

Figure 3:
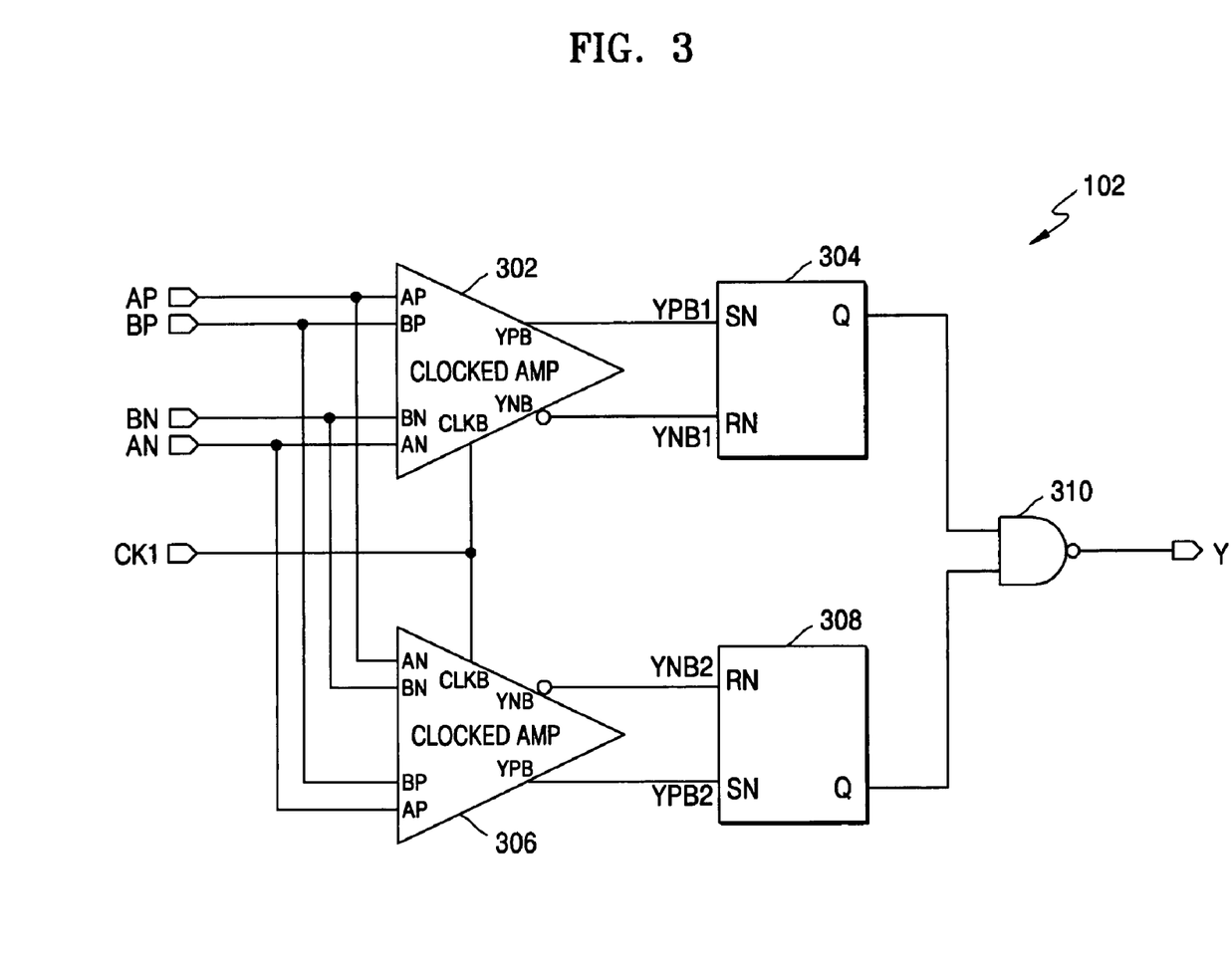
FIG. 3 is a schematic view illustrating in more detail a dual amplifier of FIG. 1, according to at least one embodiment of the present invention.

The first dual amplifier 102 out of the dual amplifier 102, 104, 106, 108, 110, and 112 is representatively illustrated in more detail in FIG. 3, according to at least one embodiment of the present invention. Construction of the other dual amplifiers 104–112 can be the same or substantially the same. The first dual amplifier 102 includes: clocked amplifiers 302 and 306, to which the clock signal CK1, the input signals AP and AN, and the reference voltage signals BP and BN are input; an S-R latch 304, to which is provided output signals of the first clocked amplifiers 302, an S-R latch 308, to which is provided output signals of the second clocked amplifiers 306; and a logical NAND gate 310, to which output signals of the S-R latches 304 and 308 are input.

Figure 4:
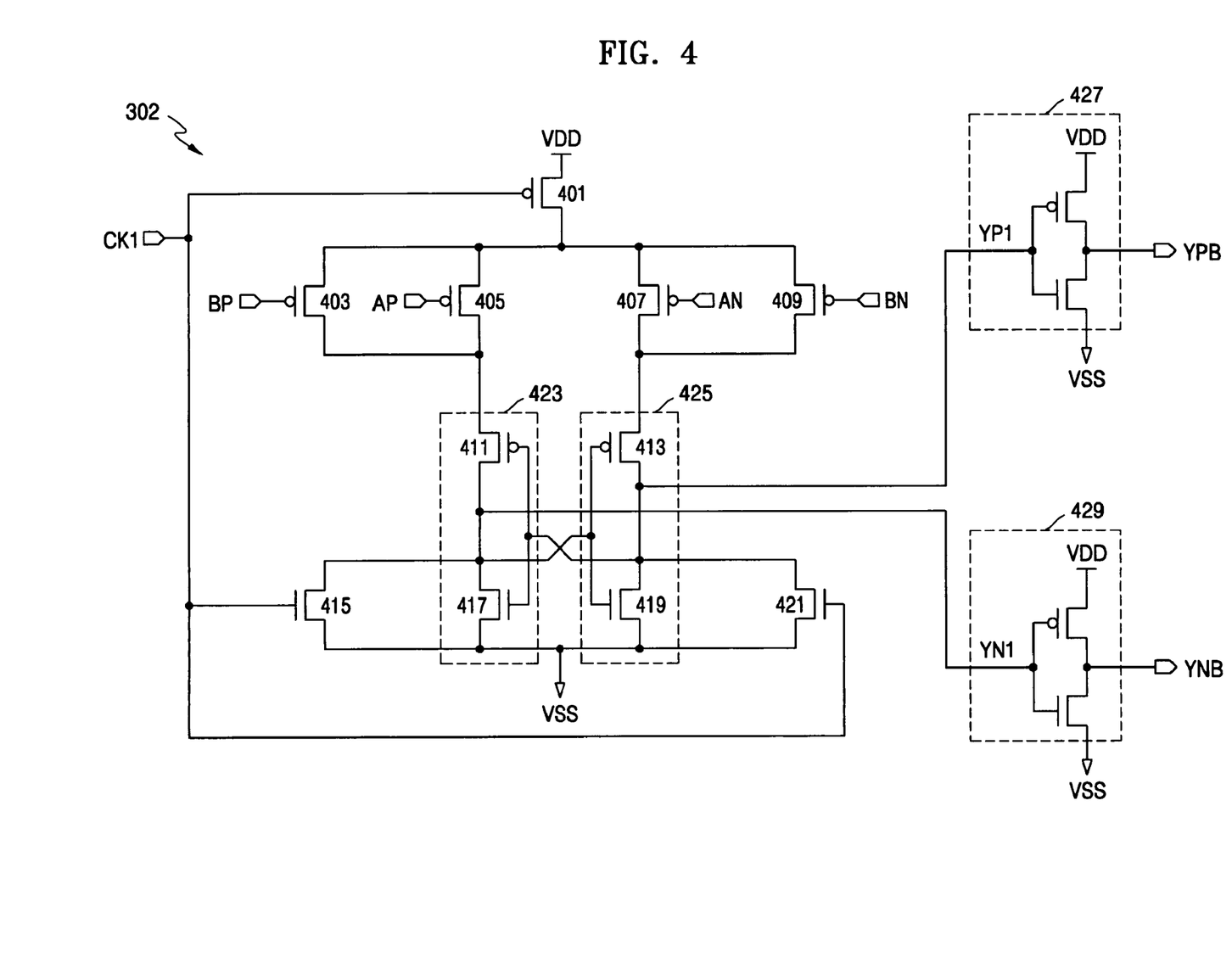
FIG. 4 is a schematic view illustrating in more detail a clocked amplifier of FIG. 3, according to at least one embodiment of the present invention.

FIG. 4 illustrates the clocked amplifier 302 of FIG. 3 in detail, according to at least one embodiment of the present invention. The clocked amplifier 302 includes: a PMOS transistor 401, whose source is connected to a power source voltage VDD and whose gate is connected to the inverted clock signal CK1; NMOS transistors 415 and 421, each of whose source is connected to a ground voltage VSS and each of whose gate is connected to the inverted clock signal CK1; PMOS transistors 405 and 407, each of whose sources are connected to the drain of the PMOS transistor 401 and whose gates are connected to the input signals AP and AN, respectively; PMOS transistors 403 and 409, each of whose sources are connected to the drain of the PMOS transistor 401 and whose gates are connected to the reference voltage signals BP and BN, respectively; a PMOS transistor 411, whose source is connected to the drains of the PMOS transistors 403 and 405; a PMOS transistor 413, whose source is connected to the drains of the PMOS transistors 407 and 409; and NMOS transistors 417 and 419, whose sources are connected to the ground voltage VSS and whose drains are connected to the drains of the PMOS transistors 411 and 413, respectively. The PMOS and NMOS transistors 411 and 417 together represent an inverter 423, and the PMOS and NMOS transistors 413 and 419 together represent an inverter 425. The inverters 423 and 425 are cross-coupled to each other. The outputs YP1 and YN1 of inverters 423 and 425 are provided to inverters 427 and 429, each of which has a similar construction to inverters 423 and 425. The outputs of the inverters 427 and 429 are output as the output signals YPB and YNB.

The operation of the clocked amplifier 302 of FIG. 4 is as follows.

The clocked amplifier 302 is enabled in response to the logic low level of the inverted clock signal CK1. When the voltage levels of the first reference voltage signal BP and the first input signal AP are higher than those of the second reference voltage signal BN and the second input signal AN, than the first and second output signals YPB and YNB are driven to the logic low level and the logic high level, respectively. When the voltage levels of the first reference voltage signal BP and the first input signal AP are lower than those of the second reference voltage signal BN and the second input signal AN, then the first and second output signals YPB and YNB are driven to the logic high level and the logic low level, respectively.

If, and only if, the difference between the first and second input signals AP and AN is larger than the difference between the first and second reference voltage signals BP and BN, then the clocked amplifier 302 decides that the input signals are valid real signals. If the difference between the first and second input signals AP and AN is smaller than the difference between the first and second reference voltage signals BP and BN, then the clocked amplifier 302 decides that the input signals are not real signals (and instead are noise and/or crosstalk).

Operation of the dual amplifier 102 of FIG. 3 depends on the operation of the clocked amplifier 302, as follows.

Firstly, if the difference between the first and second input signals AP and AN is larger than the difference between the first and second reference voltages BP and BN, then the first and second output signals YPB and YNB of the first clocked amplifier 302 are driven to the logic low level and the logic high level, respectively, and the output Q of the S-R latch 304 is driven to the logic high level. Also, in that circumstance, the first and second output signals YPB and YNB of the second clocked amplifier 306 are driven to the logic high level and the logic low level, respectively, and the output Q of the S-R latch 308 is driven to the logic low level. Accordingly, the output signal of the NAND gate 310 is driven to the logic high level.

On the other hand, if the voltage levels of the first reference voltage signal BP and the first input signal AP are lower than the voltage levels of the second reference voltage BN and the second input signal AN, then the first and second output signals YPB and YNB of the first clocked amplifier 302 are driven to the logic high level and the logic low level, respectively, and the output Q of the S-R latch 304 is driven to the logic low level. Also in that circumstance, the first and second output signals YPB and YNB of the second clocked amplifier 306 are driven to the logic low level and the logic high level, respectively, and the output Q of the S-R latch 308 is driven to the logic high level. Accordingly, the output signal of the NAND gate 310 is driven to the logic high level.

Secondly, if the difference between the first and second input signals AP and AN is smaller than the difference between the first and second reference voltages BP and BN, then the first and second output signals YPB and YNB of the first clocked amplifier 302 are driven to the logic low level and the logic high level, respectively, and the output Q of the S-R latch 304 is driven to the logic high level. Also in that circumstance, the first and second output signals YPB and YNB of the second clocked amplifier 306 are driven to the logic low level and the logic high level, respectively, and the output Q of the S-R latch 308 is driven to the logic high level. Accordingly, the output signal of the NAND gate 310 is driven to the logic low level.

In summary, the operation of the dual amplifier 102 of FIG. 3 is as follows. If the difference between the first and second input signals AP and AN is larger than the difference between the first and second reference signals BP and BN, then the dual amplifier 102 decides that the input signals AP and AN are valid real signals, and thus, the output signal of the NAND gate 310 is driven to the logic high level. If the difference between the first and second input signals AP and AN is smaller than the difference between the first and second reference signals BP and BN, then the dual amplifier 102 decides that the input signals AP and AN are not real signals, and thus, the output signal of the NAND gate 310 is driven to the logic low level.

Referring to FIG. 1, the operation of the signal detecting circuit 100 is described based on the aforementioned operation of the dual amplifier 102, as follows. The signal detecting circuit 100 decides the validity of the input signals AP and AN three times. A first detection is carried out by the first dual amplifier 102 in response to the first clock signal CK1. A second detection is carried out by the third dual amplifier 106 in response to the second clock signal CK2, which is delayed in time relative to the first clock signal CK1. A third detection is carried out by the fifth dual amplifier 110 in response to the third clock signal CK3, which is delayed in time relative to the second clock signal CK2. The signal detecting circuit 100 inputs the three detection results about the validity of the input signals AP and AN, that is, the output signals Y1, Y2, and Y3 of the first, second, and third dual amplifiers 102, 106, and 110 to the NOR gate 128. If any of the output signals Y1, Y2, and Y3 of the first, second, and third dual amplifiers 102, 106, and 110 is the logic high level, then the output signal YNR3 of the NOR gate 128 becomes the logic low level.

Figure 5A:
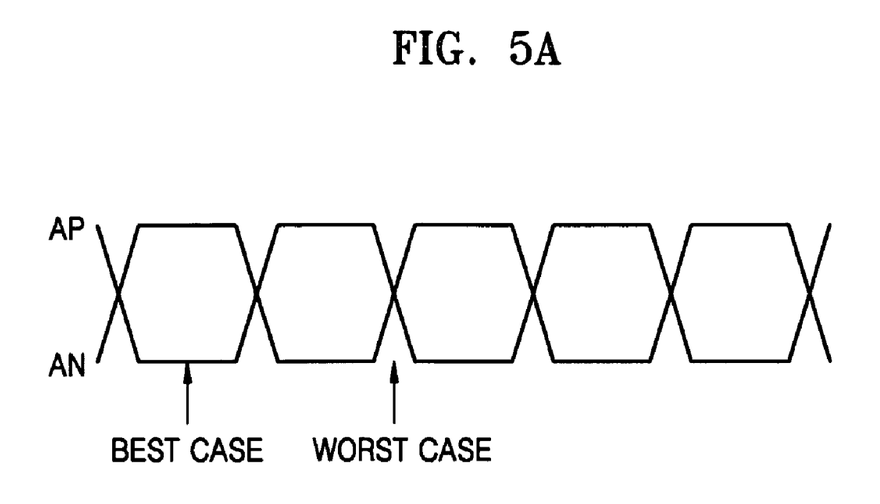
FIGS. 5A and 5B are wave forms illustrating aspects of input signal detecting/checking operations according to at least one embodiment of the present invention.

An advantage achieved by making multiple, e.g., three detections on the input signals AP and AN is described with reference to FIGS. 5A–5B, according to at least one embodiment of the present invention. FIG. 5A depicts wave forms that illustrate the best case and worst case points in time at which to detect the input signals AP and AN. At the best case point in time, since there is sufficient voltage difference between the input signals AP and AN, the detection of the input signals is stable. On the other hand, at the worst case point in time, since there is little voltage difference between the input signals AP and AN, the detection of the input signals is unstable. In order to reduce the instability, according to at least one embodiment of the present invention, the input signal detection can be carried out via multiple, e.g., three detections.

Figure 5B:
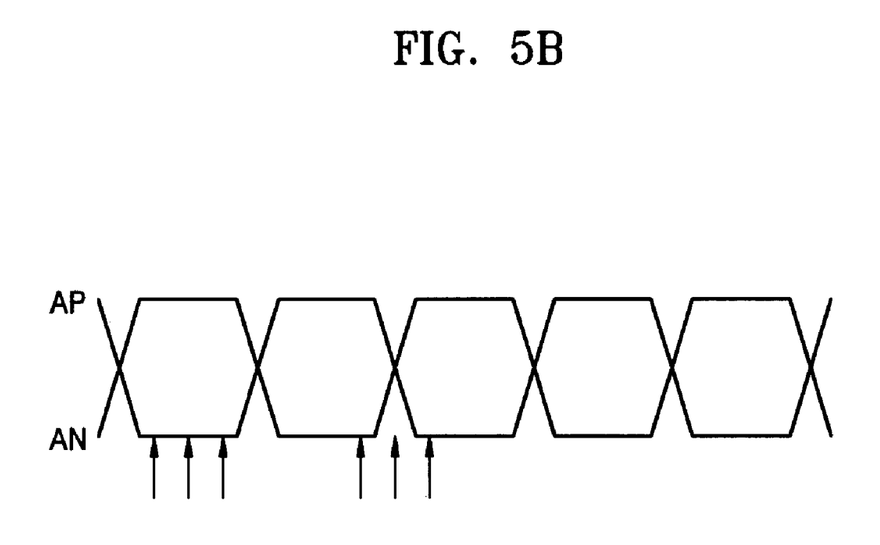

As depicted in FIG. 5B, making multiple (e.g., 3) detections times yields at least one detection (e.g., 2 for the assumption of a total of 3 detections) that does not occur at the worst case point in time. Selection of a sufficiently fast rate for the detections depends upon the frequency of AP and AN, e.g., according to known sampling theory.

On the other hand, the second, fourth, and sixth dual amplifier 104, 108, and 112 of the signal detecting circuit 100 respond to the first, second, and third inverted clock signals CK1B, CK2B, and CK3B, while the first, third, and fifth dual amplifier 102, 106, and 110 of the signal detecting circuit 100 respond to the first, second, and third non-inverted clock signals CK1, CK2, and CK3. The second, fourth, and sixth dual amplifier 104, 108, and 112 are provided in order to reduce a bouncing phenomena of the input signals AP and AN and the reference voltage signals BP and BN due to the operations of the first, third, and fifth dual amplifiers 102, 106, and 110.

The sampling circuit 132 shown in FIG. 1 performs a predetermined number of sampling operations on the output signal YNR3 of the NOR gate 128. The sampling circuit 132 is used to delay the transition time of the output signals Y and YB of the signal detecting circuit 100 in order to prevent an error of detecting the case in which the voltage levels of input signals AP and AN are lower than the reference voltage signals BP and BN and then restored to the original level as a no-signal case.

Figure 6:
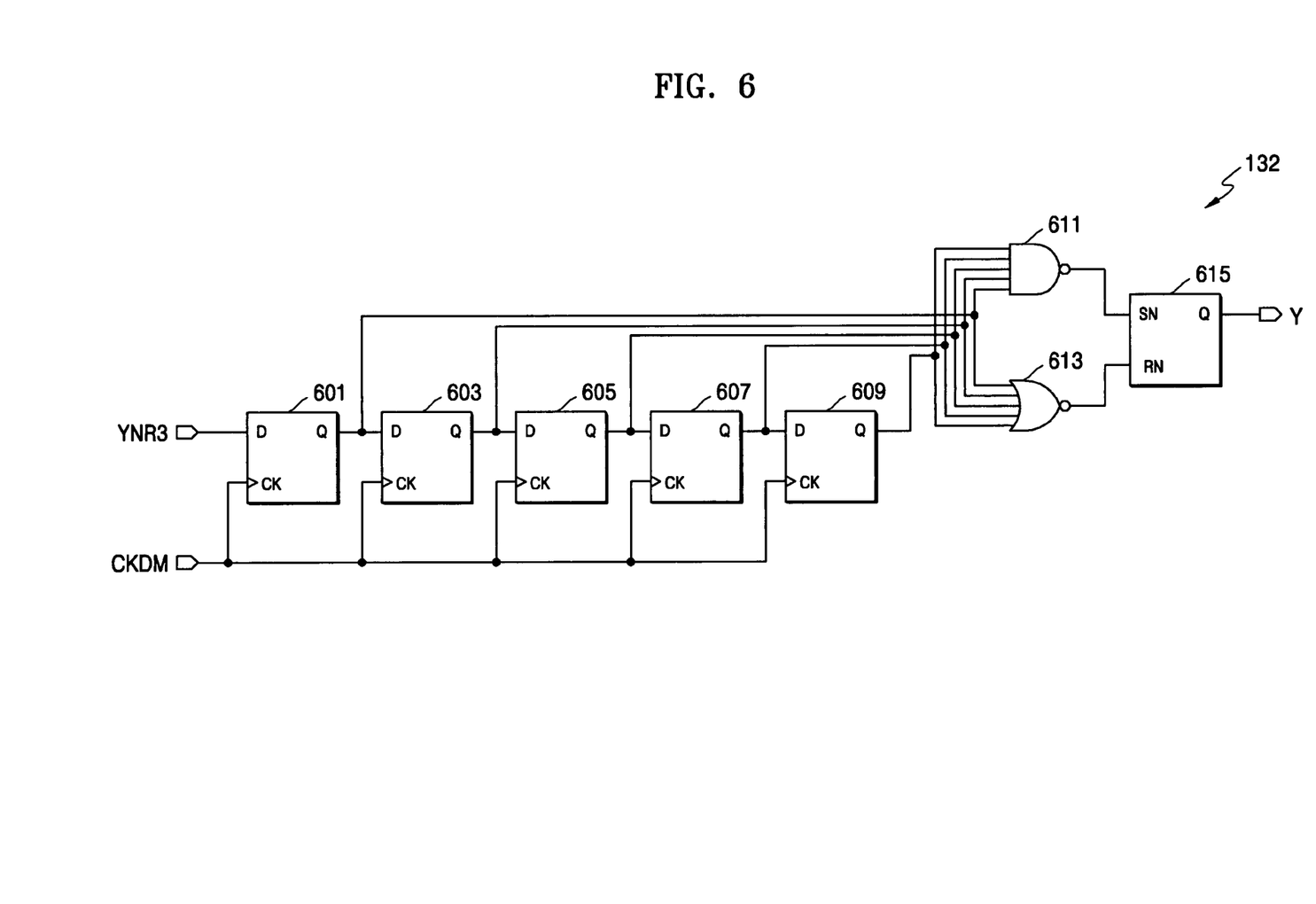
FIG. 6 is a schematic view illustrating in more detail a sampling circuit of FIG. 1, according to at least one embodiment of the present invention.

FIG. 6 illustrates the sampling circuit 132 in more detail, according to at least one embodiment of the present invention.

Referring to FIG. 6, the sampling circuit 132 comprises: five cascade-connected D flip-flops 601, 603, 605, 607, and 609, which respond to the buffered clock signal CKDM and the output signal YNR3 of the NOR gate 128 of FIG. 1; a logical NAND gate 611; a logical NOR gate 613, to which the outputs of the D flip-flops 601, 603, 605, 607, and 609 are input; and an S-R latch 615, which responds to the outputs of the NAND gate 611 and the NOR gate 613.

The operation of the sampling circuit 132 of FIG. 6 is as follows.

If the input signals AP and AN of FIG. 1 are normally detected to be valid and the output signal YNR3 of the NOR gate 128 of FIG. 1 is at the logic low level during the five clock cycles of the clock signal CK, then the outputs of the NAND gate 611 and NOR gate 613 are driven to the logic high level and the logic low level, respectively. Accordingly, the output Y of the S-R latch 615 is driven to the logic low level.

If the input signals AP and AN of FIG. 1 are real signals and abnormally reduced due to noise, etc., and thus, the output signal YNR3 of the NOR gate 128 of FIG. 1 varies from the logic low level to the logic high level during the five clock cycles of the clock signal CKDM and the output signal YNR3 is finally low, then the outputs of the NAND gate 611 and NOR gate 613 are driven to the logic high level and the logic low level, respectively. Accordingly, the output Y of the S-R latch 615 is driven to the logic low level.

If the input signals AP and AN of FIG. 1 are not real signals, and thus, the output signal YNR3 of the NOR gate 128 of FIG. 1 is at the logic high level during the five clock cycles of the clock signal CKDM, then the outputs of the NAND gate 611 and NOR gate 613 are driven to the logic low level and the logic high level, respectively. Accordingly, the output Y of the S-R latch 615 is driven to the logic high level.

That is, the sampling circuit 132 of FIG. 6 sequentially samples signal YNR3 (which indirectly represents the input signals AP and AN of FIG. 1) during the five clock cycles needed for a given signal to propagate through the five stages of D flip-flop 601–609 in order to better detect the validity of the input signals. If the input signals AP and AN are not real signals during consecutive five clock cycles of the clock signals CKDM, then the output signal Y is driven to the logic high level.

Referring to FIG. 1, if the power down signal PD is at the logic low level, then the output YDM of the stage sampling circuit 132 becomes the final output signal Y of the signal detecting circuit 100. If the power down signal PD is at the logic high level, then the final output signal Y of the signal detecting circuit 100 is set to be the logic high level. Therefore, since the signal detecting circuit 100 can adjust its operation by using the power down signal PD, unnecessary power consumption can be reduced.

Figure 7:
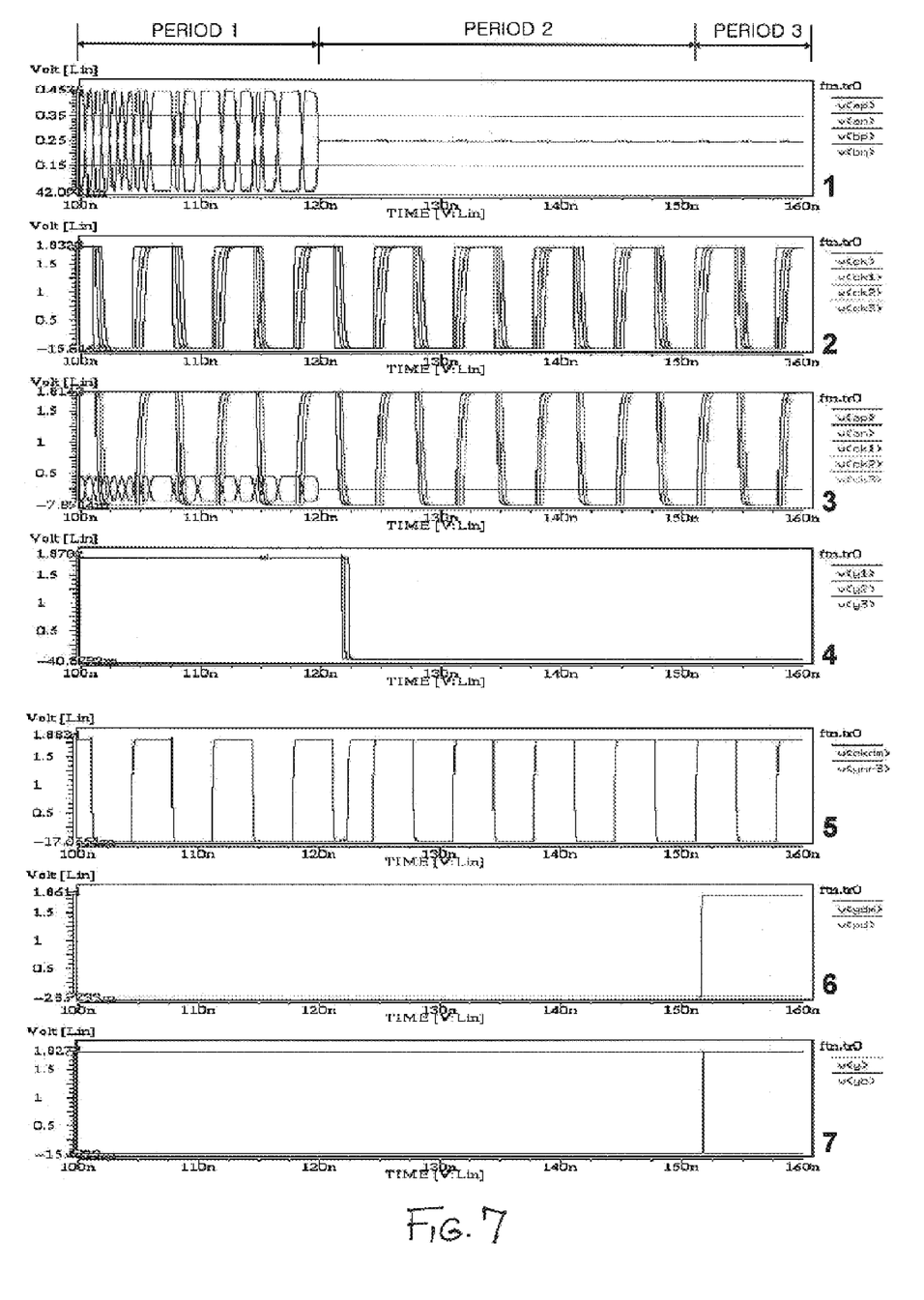
FIGS. 7 and 8 are views illustrating simulation results obtained by using an example signal detecting circuit implementation according to at least one embodiment of the present invention.
Figure 8:
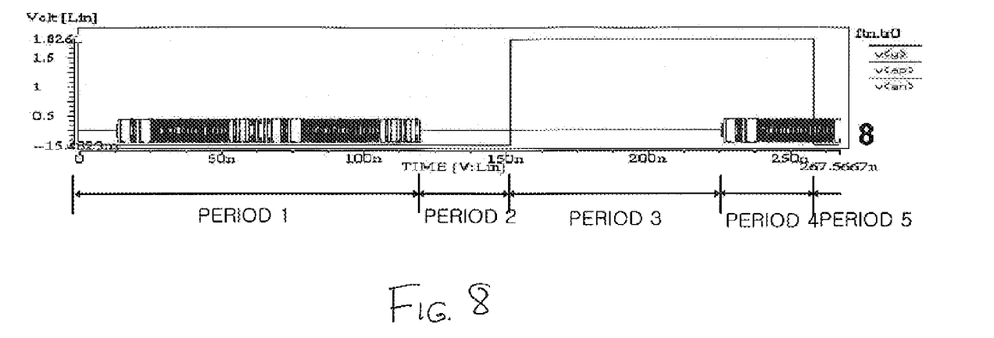

FIGS. 7 and 8 illustrate simulation results obtained by using an example implementation of the signal detecting circuit 100, according to at least one embodiment of the present invention.

Referring to FIG. 7, the first, second, and third clock signals CK1, CK2, and CK3 (which are delayed relative to the clock signal CK, respectively) are generated. In the first period (1), when the voltage levels of the first and the second input signals AP and AN are higher than threshold levels of the first and second reference voltage signals BP and BN, the output signals Y1, Y2, and Y3 of the first, second, and third dual amplifiers 102, 106, and 110 are driven to the logic high level, and the output signal YNR3 of the NOR gate 128 of FIG. 1 is driven to the logic low level. The final output signal Y of the signal detecting circuit 100 of FIG. 1 is driven to the logic low level.

In the second period (2), when the voltage levels of the first and the second input signals AP and AN are lower than threshold levels of the first and second reference voltage signals BP and BN, the output signals Y1, Y2, and Y3 of the first, second, and third dual amplifiers 102, 106, and 110 are driven to the logic low level and the output signal YNR3 of the NOR gate 128 of FIG. 1 is driven to the logic high level. During the five clock cycles of the clock signal CKDM, the output signal YNR3 of the NOR gate 128 of FIG. 1 is sampled, and at the fifth clock of the clock signal CKDM, the output signal YDM of the sampling circuit 132 of FIG. 1 is transitioned to the logic high level. The final output signal Y of the signal detecting circuit 100 of FIG. 1 is driven to the logic high level.

In the third period (3), when the first and second input signals AP and AN are detected not to be valid, the final output signal Y of the signal detecting circuit 100 of FIG. 1 is driven to the logic high level.

FIG. 8 illustrates the simulation results in a wider period including the simulation results of FIG. 7. In the first period (1), when the input signals AP and AN are received, the output of the signal detecting circuit 100 of FIG. 1 is driven to the logic low level. In the second period (2), which corresponds to the five clock cycles from the time that the input signals AP and AN are not received, the output of the signal detecting circuit 100 of FIG. 1 is driven to the logic low level. In the third period (3), when the input signals AP and AN are not received after the five clock cycles, the output of the signal detecting circuit 100 of FIG. 1 is driven to the logic high level. In the fourth period (4), which corresponds to the five clock cycles from the time that the input signals AP and AN are received again, the output of the signal detecting circuit 100 of FIG. 1 is driven to the logic high level. In the fifth period (5), when the input signals AP and AN are received after the five clock cycles, the output of the signal detecting circuit 100 of FIG. 1 is driven to the logic low level.

According to at least one embodiment of the present invention, since the input signals are detected through the input signal detection process over three clock cycles and the signal sampling process over five clock cycles, the input signal can be stably detected. In addition, since the operation of the signal detecting circuit can be adjusted in accordance with the power down signal, unnecessary power consumption can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A signal detecting circuit comprising:
   a delay circuit, which receives a base clock signal and generates multiple versions thereof having time delay relationships thereto, respectively;
   dual amplifiers, which detect valid ones of input signals by comparing the input signals with reference voltage signals in response to the multiple versions of the base clock signal, respectively;
   a combining unit, which generates a combination signal in response to output signals of the dual amplifiers; and
   a sampling circuit, which samples the combination signal according to the base clock signal and generates an output signal.

2. The signal detecting circuit according to claim 1, wherein the delay circuit includes a buffer chain having a plurality of serially connected buffers, and wherein the base clock signal is input to the buffer chain.

3. The signal detecting circuit according to claim 1, wherein each dual amplifier includes:
   a first clocked amplifier, which compares the input signals with the reference voltage signals in response to a respective one of the multiple versions of the base clock signal;
   a second clocked amplifier, which compares the input signals with the reference voltage signals in response to a respective one of the multiple versions of the base clock signal;
   a first latch, to which output signals of the first clocked amplifier are input;
   a second latch, to which output signals of the second clocked amplifier are input; and
   a logic gate, which receives and combines output signals of the first and second latches and generates the output signal of the dual amplifier.

4. The signal detecting circuit according to claim 3, wherein each of the first and second clocked amplifiers includes:
   a first PMOS transistor, whose source is connected to a power source voltage and whose gate is connected to the respective one of the multiple versions of the base clock signal;
   first and second NMOS transistors, whose sources are connected to a ground voltage and whose gates are connected to the respective one of the multiple versions of the base clock signal;
   second and third PMOS transistors, whose sources are connected to the drain of the first PMOS transistor and whose gates are connected to first and second ones of the input signals, respectively;
   fourth and fifth PMOS transistors, whose gates are connected to first and second ones of the reference voltage signals, respectively;
   a sixth PMOS transistor, whose source is connected to the drains of the second and fourth PMOS transistors, whose drain is connected to the drain of the first NMOS transistor, and whose gate is connected to the drain of the second NMOS transistor;
   a seventh PMOS transistor, whose source is connected to the drains of the third and fifth PMOS transistors, whose drain is connected to the drain of the second NMOS transistor, and whose gate is connected to the drain of the first NMOS transistor;
   a third NMOS transistor, whose drain is connected to the drains of the first NMOS transistor and the sixth PMOS transistor, whose source is connected to the ground voltage, and whose gate is connected to the drains of the seventh PMOS and second NMOS transistors;
   a fourth NMOS transistor, whose drain is connected to the drains of the second NMOS transistor and the seventh PMOS transistor, whose source is connected to the ground voltage, and whose gate is connected to the drains of the sixth PMOS and first NMOS transistors;
   a first inverter, which is connected to a connection node between the seventh PMOS and fourth NMOS transistors and outputs a first output signal of the clocked amplifier; and
   a second inverter, which is connected to a connection node between the sixth PMOS and third NMOS transistors and outputs a second output signal of the clocked amplifier.

5. The signal detecting circuit according to claim 4, wherein each of the first and second latches is an S-R latch having a set terminal, to which the first output signal of the first or second clocked amplifiers is input, and a reset terminal, to which the second output signal of the first or second clocked amplifiers is input.

6. The signal detecting circuit according to claim 1, wherein the combining unit is a NOR gate, to which the output signals of the dual amplifiers are input.

7. The signal detecting circuit according to claim 1, wherein the sampling circuit includes:
   serially-connected D flip-flops, wherein the D flip-flops receive the combination signal of the combining unit and respond to a buffered clock signal;
   a NAND gate, to which outputs of the D flip-flops are input;
   a NOR gate, to which outputs of the D flip-flops are input; and
   a latch, which responds to outputs of the NAND and NOR gates.

8. The signal detecting circuit according to claim 7, wherein the sampling circuit includes five D flip-flops.

9. The signal detecting circuit according to claim 1, wherein the multiple versions of the base clock signal include first, second and third versions thereof.

10. A signal detecting circuit comprising:
    a delay circuit, which receives a base clock signal and generates first, second, and third clock signals having time delay relationships thereto, respectively;
    dual amplifiers, which detect valid ones of input signals by comparing the input signals with reference voltage signals in response to the first, second, and third signals, respectively;
    a combining unit, which generates a combined signal by combining output signals of the dual amplifiers;
    a sampling circuit, which samples the combined signal according to the base clock signal and generates an output signal; and
    a power down control unit, which selectively releases the output signal of the sampling circuit in response to a power down signal.

11. The signal detecting circuit according to claim 10, wherein the delay circuit includes a buffer chain having a plurality of serially connected buffers, and wherein the base clock signal is input to the buffer chain.

12. The signal detecting circuit according to claim 10, wherein each dual amplifier includes:
    a first clocked amplifier, which compares the input signals with the reference voltage signals in response to a respective one of the first, second, and third clock signals;
    a second clocked amplifier, which compares the input signals with the reference voltage signals in response to the respective one of the first, second and third clock signals;
    a first latch, to which output signals of the first clocked amplifier are input;
    a second latch, to which output signals of the second clocked amplifier are input; and
    a NAND logic gate, which receives and combines output signals of the first and second latches and generates the output signal of the dual amplifier.

13. The signal detecting circuit according to claim 12, wherein each of the first and second clocked amplifiers includes:
    a first PMOS transistor, whose source is connected to a power source voltage and whose gate is connected to the respective one of the first, second and third clock signals;
    first and second NMOS transistors, whose sources are connected to a ground voltage and whose gates are connected to the respective one of the first, second and third clock signals;
    second and third PMOS transistors, whose sources are connected to the drain of the first PMOS transistor and whose gates are connected to first and second ones of the input signals, respectively;
    fourth and fifth PMOS transistors, whose gates are connected to first and second ones of the reference voltage signals, respectively;
    a sixth PMOS transistor, whose source is connected to the drains of the second and fourth PMOS transistors, whose drain is connected to the drain of the first NMOS transistor, and whose gate is connected to the drain of the second NMOS transistor;
    a seventh PMOS transistor, whose source is connected to the drains of the third and fifth PMOS transistors, whose drain is connected to the drain of the second NMOS transistor, and whose gate is connected to the drain of the first NMOS transistor;
    a third NMOS transistor, whose drain is connected to the drains of the first NMOS transistor and the sixth PMOS transistor, whose source is connected to the ground voltage, and whose gate is connected to the drains of the seventh PMOS and second NMOS transistors;
    a fourth NMOS transistor, whose drain is connected to the drains of the second NMOS transistor and the seventh PMOS transistor, whose source is connected to the ground voltage, and whose gate is connected to the drains of the sixth PMOS and first NMOS transistors;
    a first inverter, which is connected to a connection node between the seventh PMOS and fourth NMOS transistors and outputs a first output signal of the clocked amplifier; and
    a second inverter, which is connected to a connection node between the sixth PMOS and third NMOS transistors and outputs a second output signal of the clocked amplifier.

14. The signal detecting circuit according to claim 13, wherein each of the first and second latches is an S-R latch having a set terminal, to which the first output signal of the first or second clocked amplifiers is input, and a reset terminal, to which the second output signal of the first or second clocked amplifiers is input.

15. The signal detecting circuit according to claim 10, wherein the combining unit is a NOR gate, to which the output signals of the dual amplifiers are input.

16. The signal detecting circuit according to claim 10, wherein the sampling circuit includes:
    serially-connected D flip-flops, wherein the D flip-flops receive the combined signal of the combining unit and respond to a buffered clock signal;
    a NAND gate, to which outputs of the D flip-flops is input;
    a NOR gate, to which outputs of the D flip-flops is input; and
    a latch, which responds to outputs of the NAND and NOR gates.

17. The signal detecting circuit according to claim 16, wherein the sampling circuit includes five D flip-flops.

18. The signal detecting circuit according to claim 10, wherein the power down control unit includes a NOR gate, to which the power down signal and the output signal of the sampling circuit are input.

19. A method of detecting a signal, comprising:
   receiving a base clock signal and generating multiple versions thereof having time delay relationships thereto, respectively;
   detecting valid ones of input signals by comparing the input signals with reference voltage signals in response to the multiple versions of the base clock signal, respectively;
   generating a combination signal in response to comparison outputs of the detecting step; and
   sampling the combination signal according to the base clock signal in order to produce an output signal.

20. The method of claim 19, wherein the combination signal is sampled during five clock cycles of the base clock signal.

21. The method of claim 19, wherein the generating of multiple versions includes generating first, second and third versions.

22. A method of detecting a signal, comprising:
   receiving a base clock signal and generating first, second, and third clock signals having time-delay relationships thereto, respectively;
   detecting valid ones of input signals by comparing the input signals with reference voltage signals in response to the first, second, and third clock signals, respectively;
   generating a combination signal in response to comparison outputs of the detecting step;
   sampling the combination according to the base clock signal and generating a sampling signal; and
   selectively releasing the sampling signal in response to a power down signal.

23. The method of detecting a signal according to claim 22, wherein the combination signal is sampled during five clock cycles of the base clock signal.

* * * * *